(12) United States Patent
Nangalia et al.

(10) Patent No.: US 8,946,891 B1
(45) Date of Patent: Feb. 3, 2015

(54) MUSHROOM SHAPED BUMP ON REPASSIVATION

(75) Inventors: Sundeep Nand Nangalia, Raleigh, NC (US); Karthikeyan Dhandapani, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 28 days.

(21) Appl. No.: 13/603,039

(22) Filed: Sep. 4, 2012

(51) Int. Cl.
H01L 23/48 (2006.01)
H01L 23/52 (2006.01)
H01L 23/00 (2006.01)

(52) U.S. Cl.
CPC ............... *H01L 24/11* (2013.01); *H01L 24/13* (2013.01)
USPC ............ 257/737; 257/738; 438/612; 438/613

(58) Field of Classification Search
CPC ........... H01L 2224/73265; H01L 2924/01029; H01L 2924/014; H01L 2924/01013; H01L 24/13; H01L 2924/01079; H01L 24/16; H01L 2224/13007; H01L 2225/06513; H01L 24/10; H01L 24/14; H01L 2924/01005; H01L 2224/03912; H01L 2224/81
USPC .................. 257/E21.508, E23.021, 737, 738; 438/612–613
See application file for complete search history.

(56) References Cited

U.S. PATENT DOCUMENTS

| | | | |
|---|---|---|---|
| 5,293,006 A * | 3/1994 | Yung ............................ | 174/261 |
| 5,949,141 A | 9/1999 | Farnworth et al. | |
| 7,834,454 B2 * | 11/2010 | Rinne et al. ................. | 257/737 |
| 7,972,521 B2 | 7/2011 | Sharma et al. | |
| 2006/0279000 A1 | 12/2006 | Chang et al. | |
| 2008/0230897 A1 | 9/2008 | Machida | |

FOREIGN PATENT DOCUMENTS

| | | |
|---|---|---|
| JP | 64-061934 | 3/1989 |
| JP | 04-139735 | 5/1992 |
| JP | 07-078826 | 3/1995 |
| JP | 2005-123358 | 5/2005 |
| KR | 2001-0083214 | 8/2001 |

OTHER PUBLICATIONS

'Wafer level packaging having bump-on-polymer structure,' by John J.H. Reche and Deok-Hoon Kim, Microelectronics Reliability 43, pp. 879-894 (2003).

(Continued)

*Primary Examiner* — Theresa T Doan
(74) *Attorney, Agent, or Firm* — McAndrews, Held & Malloy

(57) ABSTRACT

Systems, methods and/or techniques for mushroom shaped bump on repassivation are described. A method of forming a chip scale package may include applying a first photoresist layer over a semiconductor wafer, developing away a portion of the first photoresist layer to define a cylindrically shaped template with substantially vertical side walls, and plating metal at least partially within the template to form a bump. The bump may include a first cylindrical base portion, a cap, and a lip formed by a portion of the cap that extends horizontally outward beyond the first cylindrical base portion. The cap and lip may be formed such that a vertical distance exists between the lip and the semiconductor wafer, defining an intrusion area. The method may include removing excess portions of the first photoresist layer, including portions residing in the intrusion area, to isolate the bump.

20 Claims, 12 Drawing Sheets

(56) References Cited

OTHER PUBLICATIONS

'MicroCSP Wafer Level Chip Scale Package,' Rev. B, by John Jackson and Alan O'Donnell, Analog Devices, Application Note, AN-617, pp. 1-12 (© 2007).

'The Chip Scale Package (CSP),' 2000 Packaging Databook, Chapter 15 (2000).

Enhanced Polymer Passivation Layer for Wafer Level Chip Scale Package, by Huihua Shu, Dissertation, Auburn University, Auburn, Alabama, May 7, 2012.

Solder Joint Reliability of CSP Versus BGA Assemblies, by Jean-Paul Clech, Ph.D., EPSI Inc., Montclair, NU (2000).

* cited by examiner

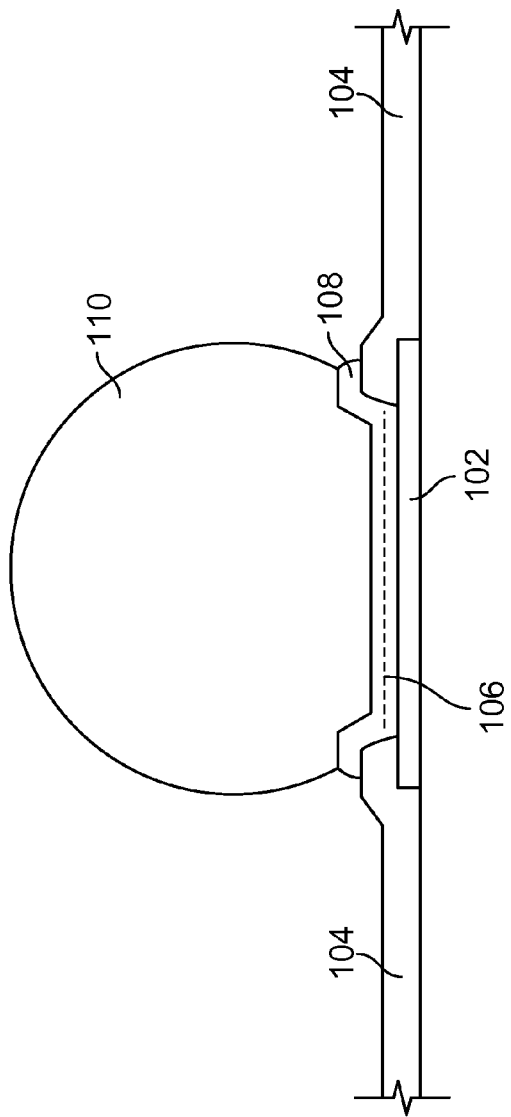

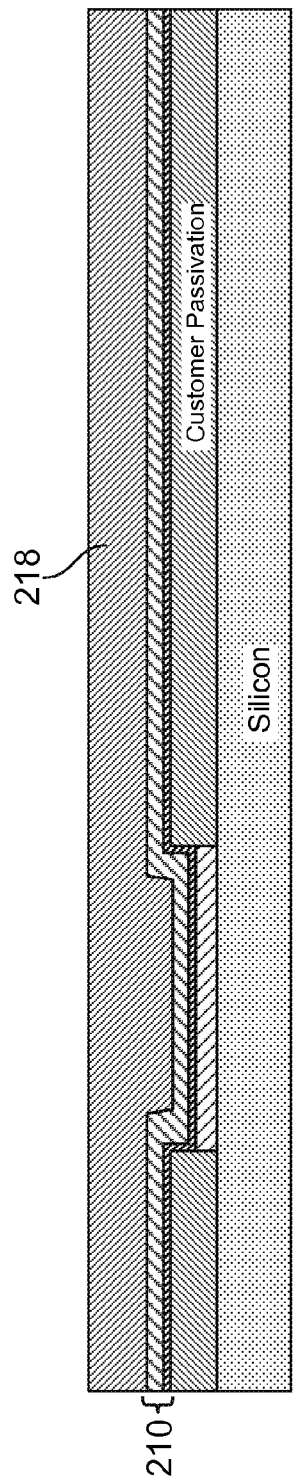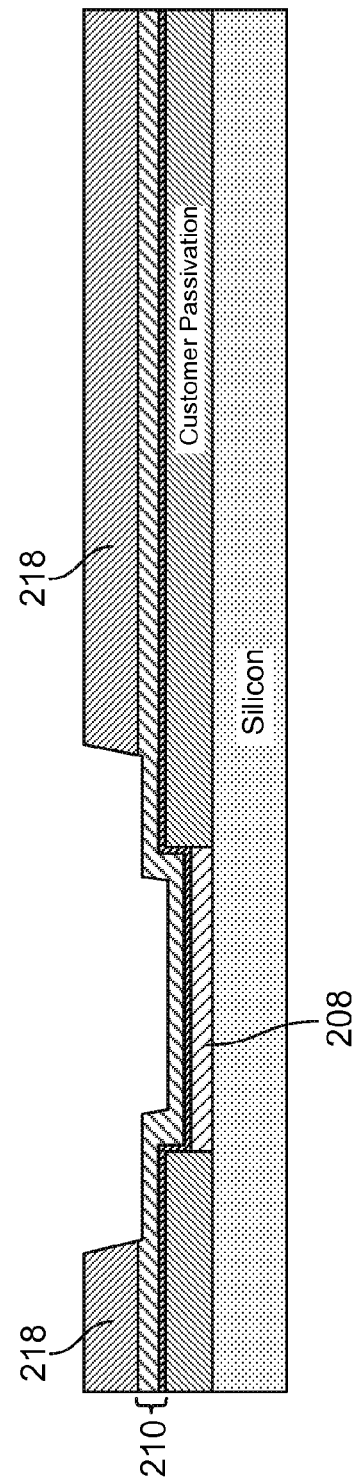

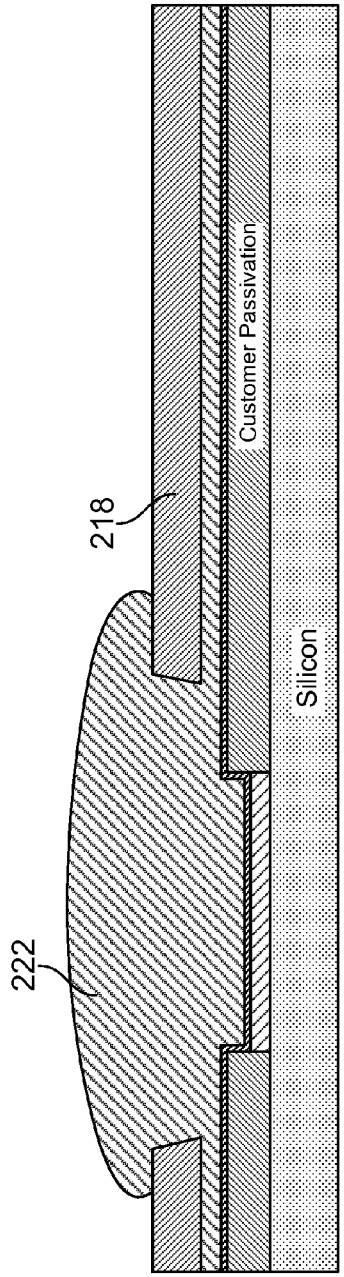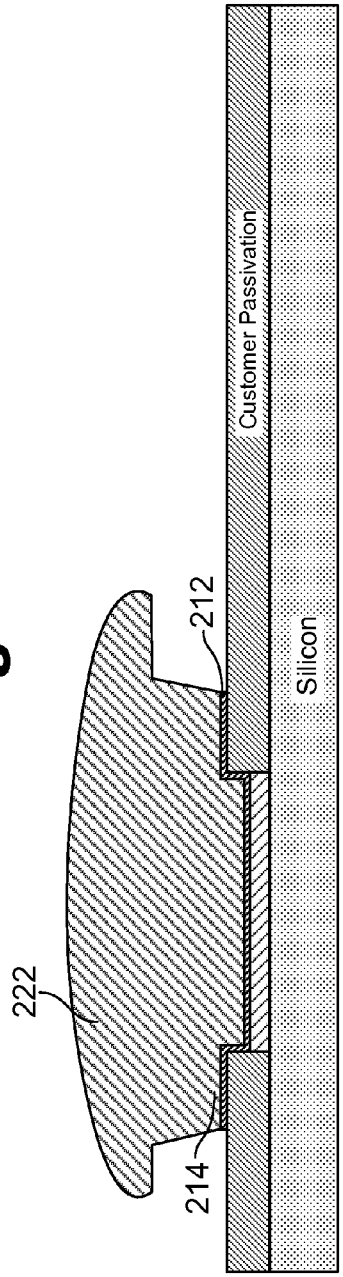

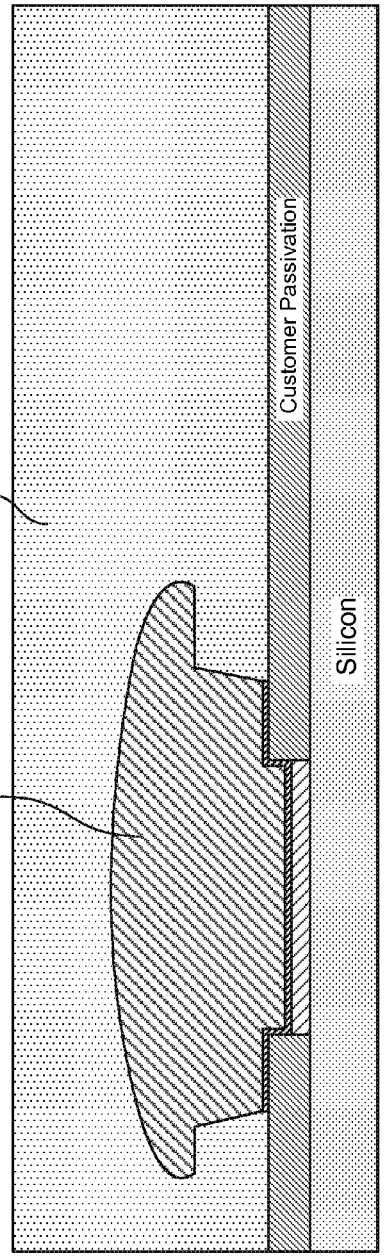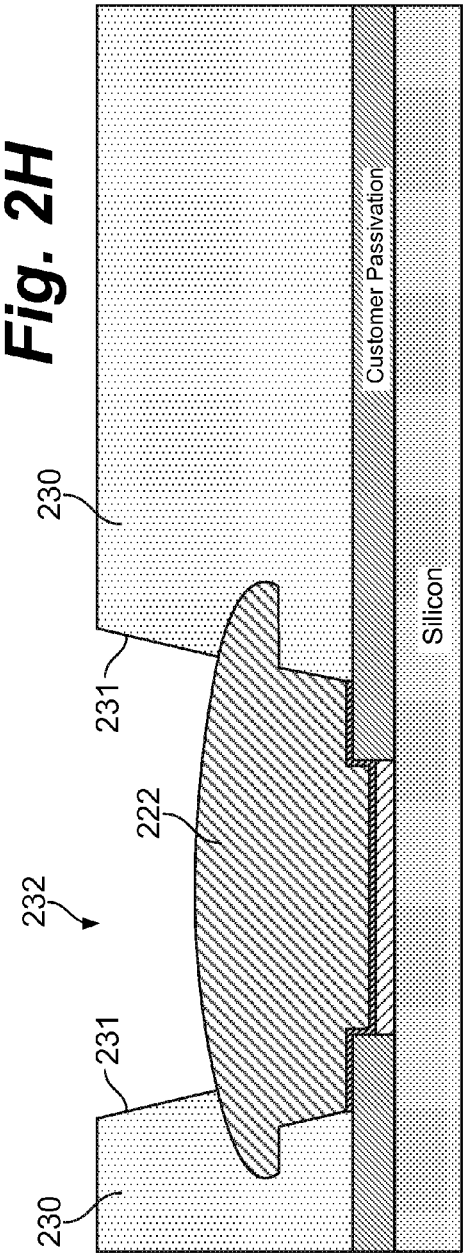

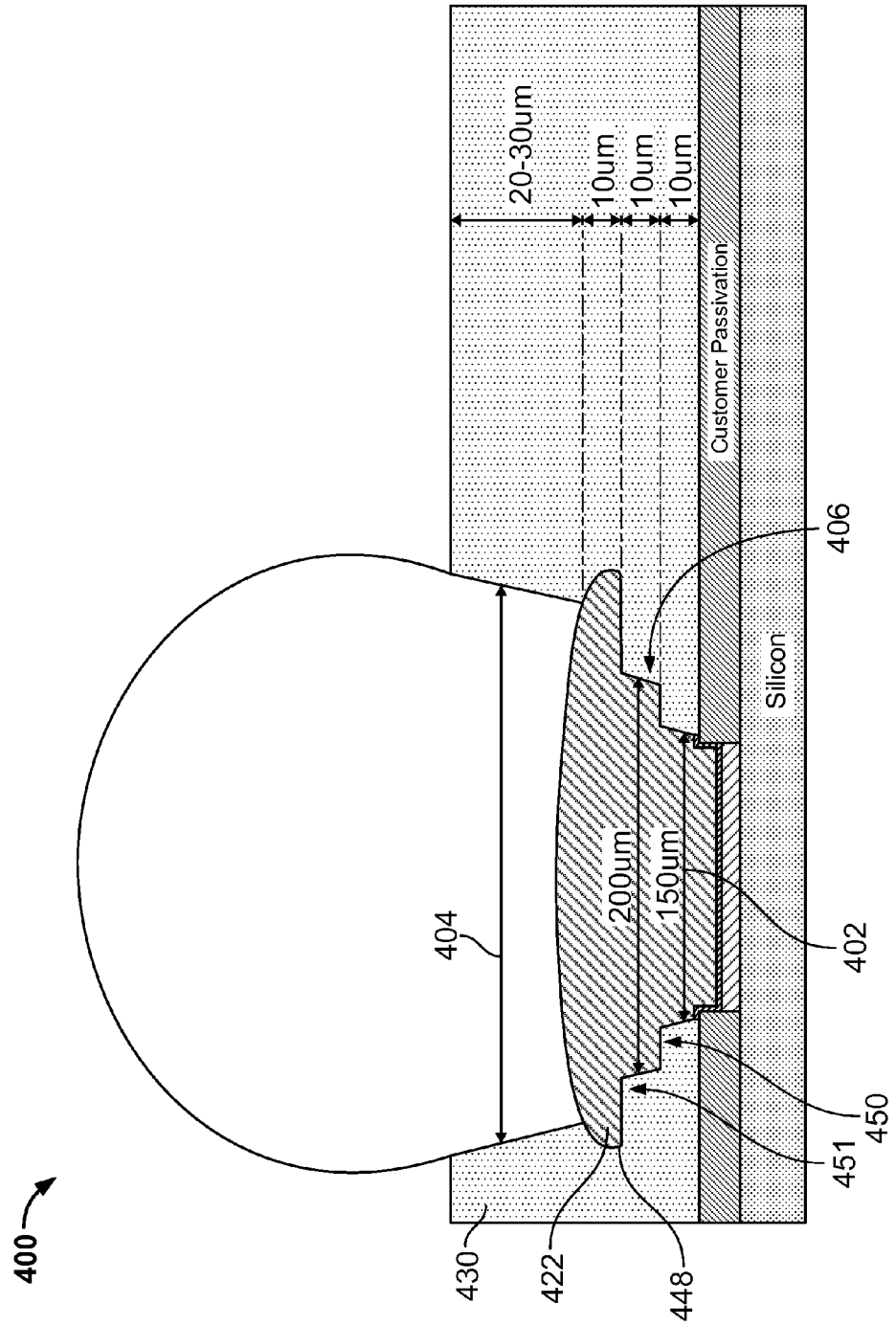

MUSHROOM SHAPED BUMP ON REPASSIVATION

CROSS-REFERENCE TO RELATED APPLICATIONS

None.

FIELD

The present disclosure relates to under bump material (UBM) and/or capture pads and/or bumps related to chip scale packages, and more particularly to one or more systems, methods, routines and/or techniques for forming mushroom shaped bump(s) on repassivation.

BACKGROUND

A wafer-level chip scale package (CSP) is, generally speaking, a package for an integrated circuit that is substantially the size of the integrated circuit, which uses a wafer-level processing technique.

BRIEF DESCRIPTION OF THE DRAWINGS

Several features and advantages are described in the following disclosure, in which several embodiments are explained, using the following drawings as examples.

FIG. 1 shows an example of a ball-drop wafer level chip scale packaging technique.

FIG. 2C depicts a side-view illustration of a model that shows example components, materials, layers and/or the like that may be used to create a mushroom shaped bump on repassivation, according to one or more embodiments of the present disclosure.

FIG. 2D depicts a side-view illustration of a model that shows example components, materials, layers and/or the like that may be used to create a mushroom shaped bump on repassivation, according to one or more embodiments of the present disclosure.

FIG. 2E depicts a side-view illustration of a model that shows example components, materials, layers and/or the like that may be used to create a mushroom shaped bump on repassivation, according to one or more embodiments of the present disclosure.

FIG. 2F depicts a side-view illustration of a model that shows example components, materials, layers and/or the like that may be used to create a mushroom shaped bump on repassivation, according to one or more embodiments of the present disclosure.

FIG. 2G depicts a side-view illustration of a model that shows example components, materials, layers and/or the like that may be used to create a mushroom shaped bump on repassivation, according to one or more embodiments of the present disclosure.

FIG. 2H depicts a side-view illustration of a model that shows example components, materials, layers and/or the like that may be used to create a mushroom shaped bump on repassivation, according to one or more embodiments of the present disclosure.

FIG. 4 depicts a side-view illustration of a model that shows example components, materials, layers and/or the like that may be used to create a mushroom shaped bump on repassivation, according to one or more embodiments of the present disclosure.

DETAILED DESCRIPTION

Figure 2A:
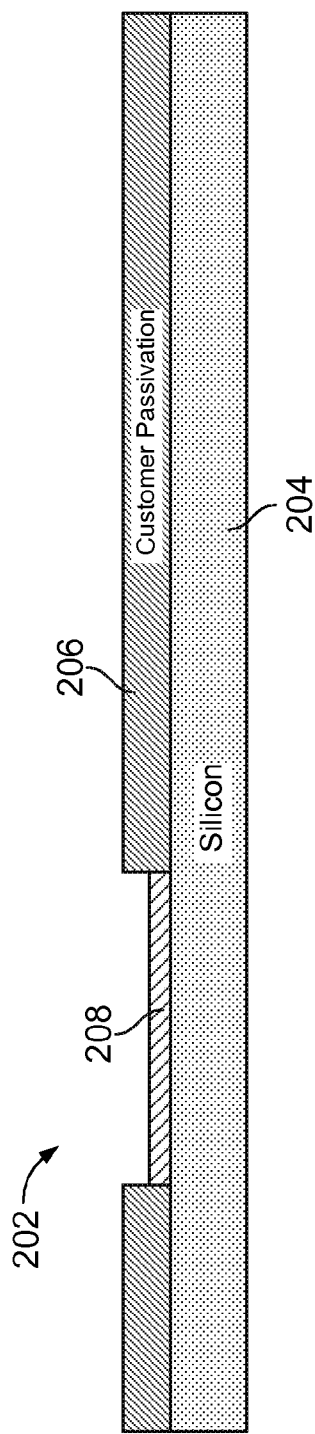
FIG. 2A depicts a side-view illustration of a model that shows example components, materials, layers and/or the like that may be used to create a mushroom shaped bump on repassivation, according to one or more embodiments of the present disclosure.

FIG. 1 shows an example of a "ball drop" WLCSP technique. FIG. 1 shows that a customer-provided wafer or chip may include a number (though only one is shown) of bond pads or metal pads 102 used by each chip to establish electrical connections to the chip. The remainder of the integrated circuit (silicon) resides below (not shown) the metal pads 102. The customer-provided wafer or chip may include a passivation layer 104, that includes passivation openings or vias 106 (shown in the dotted line area) to expose the bond pads 102. A via refers generally to a hole that extends through one or more layers of a chip package to expose an electrical contact. The passivation layer may, for example, comprise a layer of photo-imageable or photosensitive polymer film. The passivation layer or film protects the underlying integrated circuit from the ambient environment.

Once provided with the customer-wafer, a WLCSP process may involve depositing an under bump material or metal (UBM) layer 108, for example consisting of a nickel gold or nickel copper metal, followed by dropping a solder ball 110 in each of the passivation openings 106. The UBM may also be referred to as a capture pad. A capture pad may refer generally to an electrically conductive layer used to form an electrical connection with the bond pad or metal pad of the customer wafer, which in turn forms a connection with the circuit board or silicon. The wafer may then be subjected to a thermal cycle during which time each of the solder balls 110 melts and then cools in a well-defined shape on top of the UBM layer 108.

The final integrated circuit and package may be mounted on a circuit board using heat to melt the solder balls 110 and attach the integrated circuit and package (collectively, the "chip") to the circuit board. An underfill material may be inserted between the chip and the circuit board, for example to deal with the differences in thermal expansion coefficients between the chip and the circuit board that may lead to undesirable pressure on one or more bumps of the chip package. The underfill material may act like glue, holding the chip firmly to the circuit board, absorbing some pressure and resisting expansion of the board in the area of the chip. Portions of the present disclosure describe one or more systems, methods, routines and/or techniques for forming a mushroom shaped bump, for example on repassivation. The present disclosure, for example, describes a mushroom shaped and/or plated under bump material (UBM) and/or capture pad that includes a lip that raises the edges of the UBM vertically off of the customer-provided wafer. The gap between the lip and the customer wafer may be filled with a photosensitive material, for example a solderbrace (sb) material. In some embodiments, the vertical thickness of copper UBM, including the distance between the customer wafer (e.g., a semiconductor wafer, for example, produced by a third party or customer and received by a maker of chip scale packages) and the lip, and the distance between the lip and the top of the UBM, may be important, for example to optimize SJR (Solder Joint Reliability).

Figure 2B:
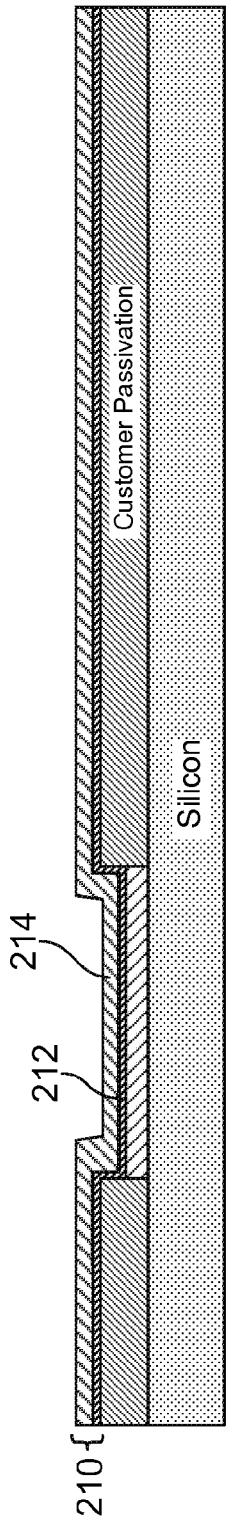
FIG. 2B depicts a side-view illustration of a model that shows example components, materials, layers and/or the like that may be used to create a mushroom shaped bump on repassivation, according to one or more embodiments of the present disclosure.

FIGS. 2A-2I depict side-view illustrations of models that show example components, materials, layers and the like that may be used to create a mushroom shaped bump on repassivation, according to one or more embodiments of the present disclosure. FIG. 2A shows a side view illustration of an example customer wafer 202 (e.g., a semiconductor wafer, for example, produced by a third party or customer and received by a maker of chip scale packages). The customer wafer 202 may include a silicon layer 204, a customer passivation layer 206 and a metal pad 208. FIG. 2B shows a side-view illustration of a seed layer 210 that may be applied on top of the customer wafer. The seed layer 210 may be the first layer added in the wafer-level chip scale packaging technique, and subsequent FIGS. 2C-2I show additional components, materials, layers and the like that may be added and/or used in the WLCSP technique. Referring again to FIG. 2B, seed layer 210 may include an adhesion layer 212, for example, comprised of titanium (Ti) or TiTungsten (TiW). The adhesion layer 212 may serve to adhere the final bump and/or UBM firmly to the customer wafer while still being electrically conductive. Seed layer 210 may include a conductive layer 214, for example, comprised of a metal such as copper (CU). Some embodiments of the present disclosure may use copper (CU) for the conductive layer 214.

FIGS. 2C and 2D show side-view illustrations of a photoresist (PR) layer 218 that may be applied on top of the seed layer 210. Photoresist materials are extremely sensitive to certain types of light and may be developed away after exposure to such light. FIG. 2C shows the PR layer 218, for example, after it has been coated on top of the seed layer 210. FIG. 2D shows the PR layer 218, for example, after a portion of the PR layer has been developed away to reveal a portion of the seed layer 210 below, for example, a portion that is above the metal pad 208 of the customer wafer. This process of developing away a portion of the PR layer may also be referred to as "defining the template" within which the UBM and/or capture pad and/or bump may be plated.

FIG. 2E shows a side-view illustration of a UBM and/or capture pad and/or bump 222, for example, that has been plated within the template defined by the PR layer 218. Bump 222 may be comprised of a metal, such as copper (CU). Some embodiments of the present disclosure may use copper (CU) for the bump 222, for example because copper may be significantly cheaper than other metals used by existing WLCSP techniques, for example, Ni—Au (Nickel-Gold). It should be understood that the bump 222 could be comprised of other metals, such as nickel (Ni), nickel-copper (Ni+Cu) and/or nickel-gold (Ni+Au). Additionally, it should be understood that the terms UBM, capture pad, bump or the like may be used interchangeably, to a certain extent, to refer generally to an electrically conductive layer and/or structure that forms an electrical connection with the bond pad or metal pad of the customer wafer. As can be seen in FIGS. 2E and 2F, the bump 222, when plated, may bond to additional layers previously added during the WLCSP process, for example adhesion layer 212 and conductive layer 214 (also shown in FIG. 2B). Therefore, a reference to a UBM and/or capture pad and/or bump, depending on the context, may refer to the plated bump 222 only, or it may also include one or more layers that were added between the bump and the customer wafer during the WLCSP process. FIG. 2F shows a side-view illustration of the bump 222, for example, after the PR layer 218 and excess portions of the adhesion layer 212 and the conductive layer 214 (collectively, the seed layer) have been removed. Because the PR layer 218 is made of a photoresist material, it may be developed after exposing it to certain types of light. The adhesion layer 212 and the conductive layer 214 (collectively, the seed layer) may be etched by exposing them to certain types of chemicals. Removing the PR layer 218 and the seed layer (adhesion layer 212 and conductive layer 214) may serve to electrically isolate the bump 222 from other conductive structures applied on the customer wafer, for example other bump structures.

FIG. 2G shows a side-view illustration of a repassivation layer 230. In some embodiments, the repassivation layer 230 is solderbrace (sb) or solderbrace material. Repassivation may refer generally to one or more additional passivation layers, beyond the customer passivation layer, that are added during the wafer-level chip scale packaging process. Solderbrace (sb) may refer to a unique type of repassivation that may eliminate the need for underfill and may be used to improve the reliability of the solder joints between the chip (integrated circuit and package) and the circuit board. Solderbrace materials may have several unique properties that make them different from other repassivation materials. The repassivation layer 230 may be comprised of photo-imageable or photosensitive polymer film with excellent electrical and/or mechanical properties. For example, polymers used in repassivation may include polybenzoxazole (PBO) and/or polyimide (PI). The repassivation layer 230 or the sb may be screen printed (or just "printed") over the top of the customer wafer and the bump 222. The screen printing process may apply the repassivation material through a metal mesh. In alternate embodiments, other processes could be used to apply the repassivation layer 230, for example, the repassivation layer may be sprayed, coated, laminated or the like. It should be understood that although FIGS. 2G-2I depict and describe a repassivation layer 230, alternate embodiments of the present disclosure may exclude or omit the repassivation layer.

Therefore, some embodiments of the present disclosure may include a bump 222, without a repassivation layer. In other words, the systems, methods, routines and/or techniques of the present disclosure may be used to form mushroom shaped bumps on a customer wafer, either with or without a repassivation layer.

FIG. 2H shows a side-view illustration of a repassivation layer 230, for example, after a via 232 has been defined. A via refers generally to a hole that extends through one or more layers of a chip package to expose an electrical contact. In the embodiment of FIG. 2H, the via 232 may extend through the repassivation layer 230 to expose the bump 222. Because the repassivation layer 230 may be made of a photosensitive material, it may be developed away by exposing it to certain types of light.

Figure 2I:
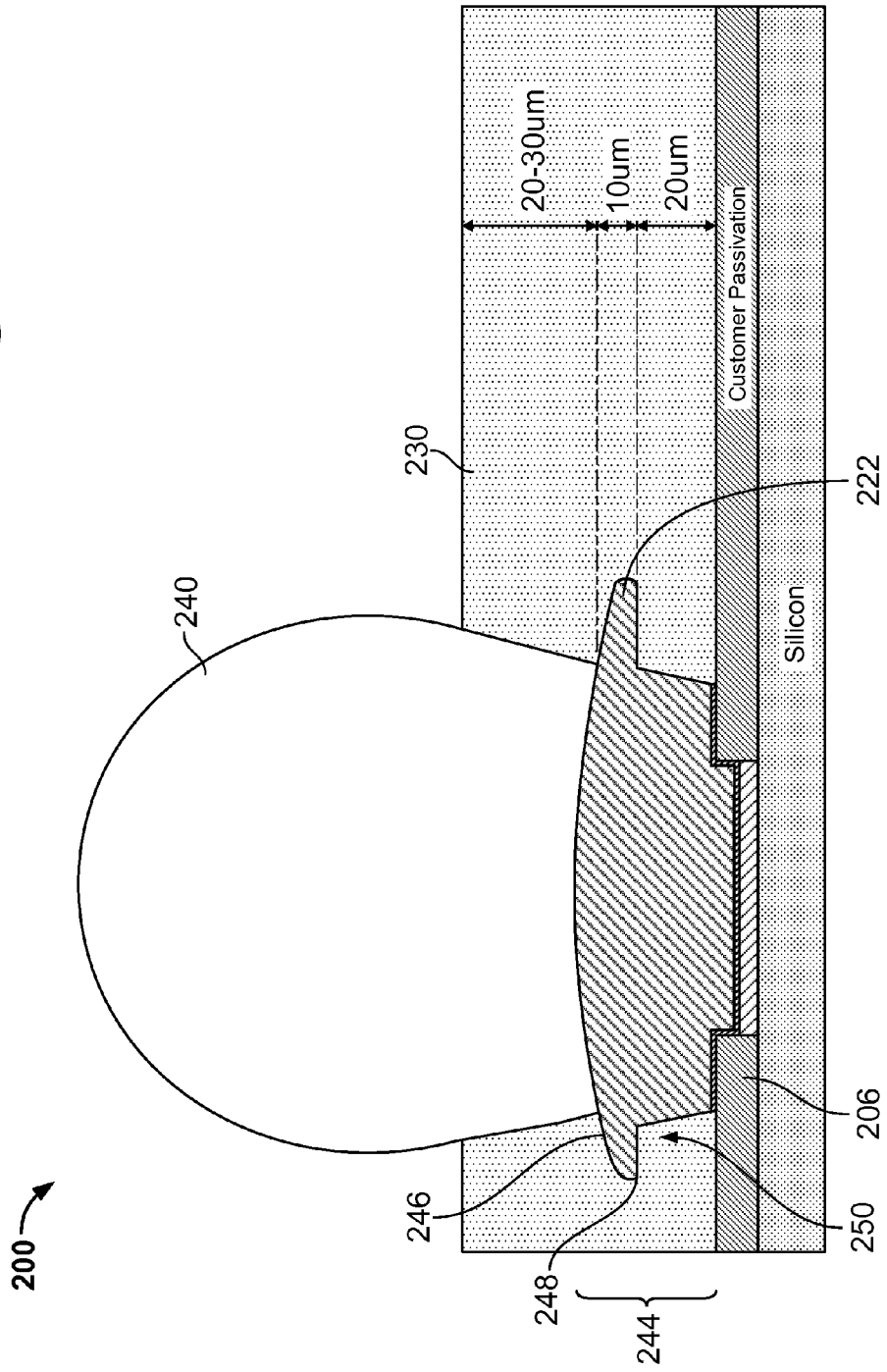
FIG. 2I depicts a side-view illustration of a model that shows example components, materials, layers and/or the like that may be used to create a mushroom shaped bump on repassivation, according to one or more embodiments of the present disclosure.

FIG. 2I shows a side-view illustration of a solder ball 240 that may be placed on top of the bump 222, for example, at least partially within a via 232 defined by side walls 231 (shown in FIG. 2H) of the repassivation layer 230. In some embodiments, once the ball is placed or "dropped" on top of the bump 222, the whole wafer may be heated up, for example using a reflow process, causing the solder ball 240 to melt and bond to the metal of the bump 222. At this point, the customer wafer and the package (bump, repassivation layer, solder ball, etc.) may be mounted on a circuit board.

As can be seen in FIG. 2I, the WLCSP technique(s) shown in FIGS. 2A-2I may result in a mushroom shaped bump 222. The mushroom shaped bump 222 may include a domed cap or top 246 and a lip 248, where the lip 248 may hang or extend horizontally over an intrusion area 250 that may be filled by part of a repassivation layer 230. In other words, the edge (also generally shown at point 248) of the final UBM and/or capture pad and/or bump 222 may be raised up off the customer passivation 206. The lip 248 may extend horizontally beyond the sidewalls of the base (or stem) by various amounts (for example, by at least 5% of the base diameter, by at least 10% of the base diameter, by at least 15% of the base diameter, by at least 20% of the base diameter, or by at least 25% of the base diameter). The mushroom shaped bump 222 may be comprised of a metal, such as copper (CU), nickel (Ni), nickel-copper (Ni+Cu) and/or nickel-gold (Ni+Au). The mushroom shaped bump 222 may have a thickness 244 that is greater than UBMs of existing WLCSP techniques, which may add robustness to the solder joints and provide a highly reliable UBM structure, resulting in increased solder joint reliability (SJR). The WLCSP technique of the present disclosure may create a bump 222 with this additional thickness (for example, including additional metal, such as copper) without adding much cost to the process, for example because the domed cap or top 246 and the lip 248 of the bump 222 may be formed or plated at same time as the rest of the bump 222. It should be understood that the shape of the bump 222 shown in FIG. 2I is just one example of a mushroom shaped bump, and the bump shapes contemplated by this disclosure are not limited to the exact shape of the bump shown in FIG. 2I. In one or more embodiments, however, an increased bump thickness and the overhanging lip may be important features.

FIG. 2I shows a side view illustration of a bump plating technique 200, for example near or at the end of a package-creation process. Referring to FIG. 2I, in some embodiments, the bump 222 may be supported by a repassivation layer 230 or solderbrace. It should be understood that although FIGS. 2G-2I depict and describe a repassivation layer 230, alternate embodiments of the present disclosure may exclude or omit the repassivation layer. Therefore, some embodiments of the present disclosure may include a mushroom shaped bump, without a repassivation layer. In embodiments that include a repassivation layer 230, the edges 248 of the mushroom shaped bump 222 may be raised up off the customer passivation 206 and may rest on (and apply pressure downward on) a repassivation material, such as solderbrace, instead of the customer passivation. When a structure, such as a UBM, sits on silicon or a customer-provided passivation layer, the maximum stress exerted by the structure is typically exerted downward at the edges of the structure. In some cases, pressure exerted downward by the edges of UBMs may cause cracks in the silicon or the customer-provided wafer. In one or more embodiments described here, the repassivation layer 230 or solderbrace material is much less prone to cracking than is customer passivation or silicon, nitride or the like. In other words, such a repassivation layer 230 or solderbrace material is adapted to more effectively absorb stress and strain than is customer passivation or silicon, nitride or the like, which may increase solder joint reliability (SJR).

Figure 3:
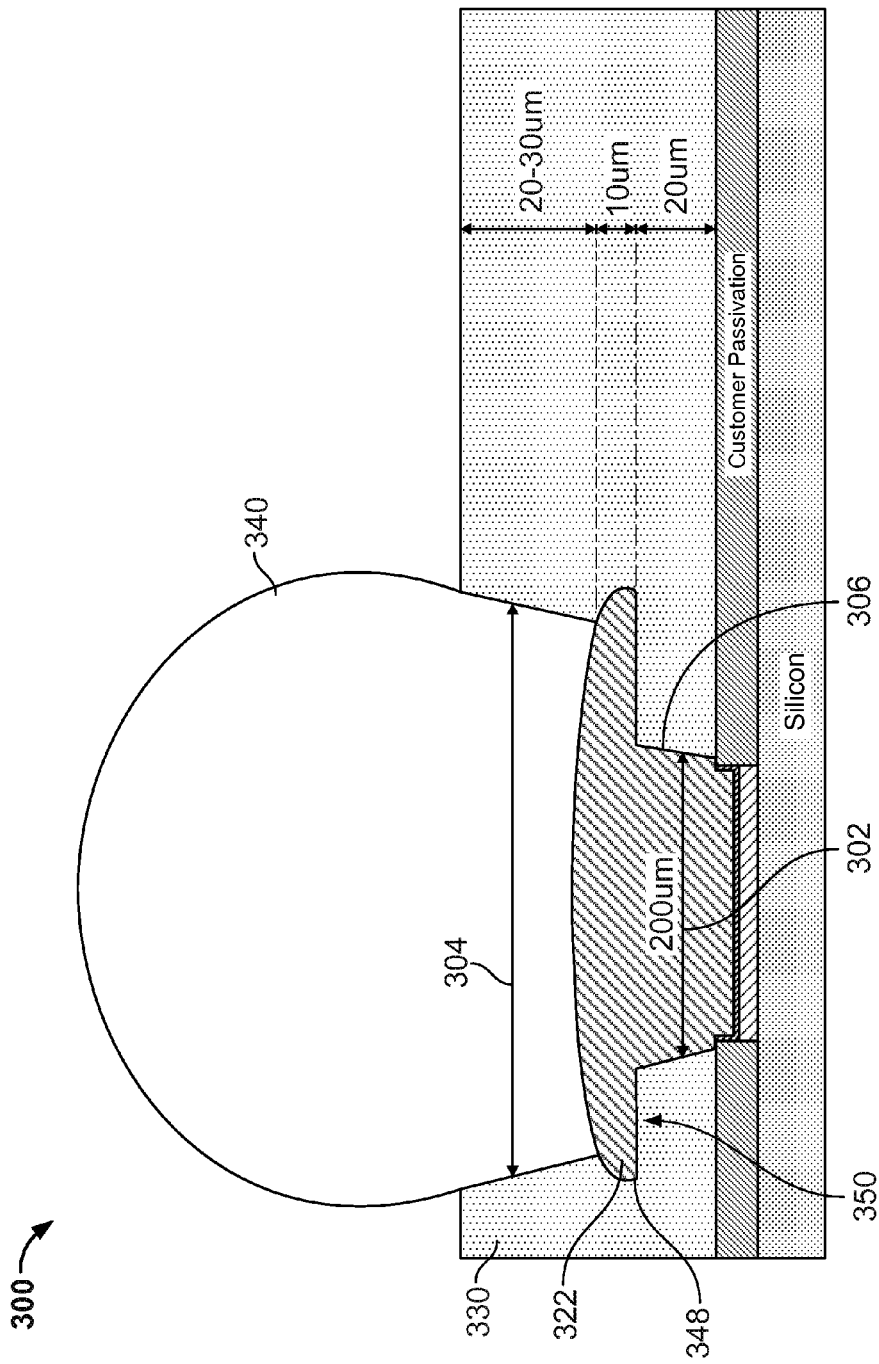
FIG. 3 depicts a side-view illustration of a model that shows example components, materials, layers and/or the like that may be used to create a mushroom shaped bump on repassivation, according to one or more embodiments of the present disclosure.

FIG. 3 depicts a side-view illustration of a model that show example components, materials, layers and the like that may be used to create a mushroom shaped bump on repassivation, according to one or more embodiments of the present disclosure. FIG. 3 shows a side view illustration of a bump plating technique 300 that may result in increased solder joint reliability (SJR). FIG. 3 shows a mushroom shaped bump 322 partially surrounded by a repassivation layer 330, for example, solderbrace. The embodiment(s) of FIG. 3, when compared to the embodiment(s) of FIGS. 2A-2I, exhibits an increased via opening 304 and a reduced template opening 302, for example a template opening with a diameter of about 200 um. The increased via opening 304 may be created by a step that is similar to the step described with regard to FIG. 2H where via 232 was defined by developing away repassivation material after exposing it to a certain type of light. In the embodiment(s) of FIG. 3, more of the repassivation layer 330 may be developed away thereby defining a via within which a solder ball 340 may be placed.

The reduced template opening 302 may be created by a step that is similar to the step described with regard to FIG. 2D where PR layer 218 is developed away. In the embodiment(s) of FIG. 3, less of the PR layer may be stripped away thereby defining a smaller template within which the UBM and/or capture pad and/or bump may be plated. The smaller diameter of the mushroom shaped bump 322 defined by the template opening 302 may be referred to as the base (also generally denoted by distance 302). Therefore, the embodiment(s) of FIG. 3 may have a narrower base 302 when compared to the base of the embodiments(s) of FIGS. 2A-2I. Additionally, because of the narrower base 302, the lip 348 may extent further outward beyond the side walls 306 of the mushroom shaped bump 322 and the intrusion area 350 may be larger, allowing for more of the repassivation layer 330 or solderbrace material to fill in underneath the mushroom shaped bump 322. This bump plating technique 300 that exhibits a narrower base and a lip that extends further outward beyond the side walls 306 of the mushroom shaped bump 322 may be referred to as "necking." Simulations have shown that the narrower base 302 and additional repassivation layer 330 or solderbrace material filled in underneath the mushroom shaped bump 322 may result in better SJR, while still leaving enough electrical contact area for proper performance. It should be understood that the shape of the bump 322 shown in FIG. 3 is just one example of a mushroom shaped bump, and the bump shapes contemplated by this disclosure are not limited to the exact shape of the bump shown in FIG. 3. In one or more embodiments, however, an increased bump thickness and the overhanging lip may be important features.

FIG. 4 depicts a side-view illustration of a model that shows example components, materials, layers and the like that may be used to create a mushroom shaped bump on repassivation, according to one or more embodiments of the present disclosure. FIG. 4 shows a side view illustration of a bump plating technique 400 that may result in increased solder joint reliability (SJR). FIG. 4 shows a mushroom shaped bump 422 partially surrounded by a repassivation layer 430, for example, solderbrace. The embodiment(s) of FIG. 4, when compared to the embodiment(s) of FIGS. 2A-2I, may exhibit an increased via opening 404 and a reduced lower template opening 402, for example a lower template opening with a diameter of about 150 um. Additionally, mushroom shaped bump 422 may have a side wall 406 with a stair-stepped structure and/or multiple bends in the side wall 406.

The reduced template opening 402 may be created by one or more steps that are similar to the step described with regard to FIG. 2D where PR layer 218 is developed away. For example, in one or more of the embodiment(s) of FIG. 4, multiple PR layers may be used. A first PR layer may be developed away resulting a first intrusion area 450, and a second PR layer may be developed away more than the first, resulting in a second intrusion area 451 that intrudes toward the center of the bump 422 less than the first intrusion area. Both the first developed PR layer and the second developed PR layer may form a stair stepped template within which the UBM and/or capture pad and/or bump may be plated. The lower diameter of the mushroom shaped bump 422 defined by the lower template opening 402 may be referred to as the base (also generally denoted by distance 402). Therefore, the embodiment(s) of FIG. 4 may have a narrower base 402 when compared to the base of the embodiments(s) of FIGS. 2A-2I. Additionally, because the side walls 406 of the mushroom shaped bump 422 are stair-stepped or have multiple-bends, a repassivation layer 330 or solderbrace material may fill in underneath the lip 448 as well as underneath the bend(s) and/or step(s) of the side walls 406 of the mushroom shaped bump 422. This bump plating technique 400 that exhibits a narrower base and stair-stepped or multiple-bend side walls 406 of the mushroom shaped bump 422 may be referred to as "stair-stepped necking" or just "necking." Simulations have shown that the narrower base 402 and additional repassivation or solderbrace support underneath the mushroom shaped bump 422 may result in better SJR, while still leaving enough electrical contact area for proper performance. It should be understood that the shape of the bump 422 shown in FIG. 4 is just one example of a mushroom shaped bump, and the bump shapes contemplated by this disclosure are not limited to the exact shape of the bump shown in FIG. 4. In one or more embodiments, however, an increased bump thickness and the overhanging lip may be important features.

A mushroom shaped bump may lead to greater solder joint reliability (SJR). Different embodiments, for example the embodiments of FIGS. 2A-2I, FIG. 3 and FIG. 4, may achieve different levels of improved SJR. In general, simulations show that a mushroom shaped bump may improve SJR by between about 15% to about 30% over existing bump plating techniques. In some embodiments of the present disclosure, the specific dimensions of the mushroom shaped bump and/or the via opening (template) in the repassivation material may be important to further improve and/or optimize SJR. Specific dimensions that lead to optimal SJR may be referred to as "critical dimensions" for the bump and the template.

Figure 5A:
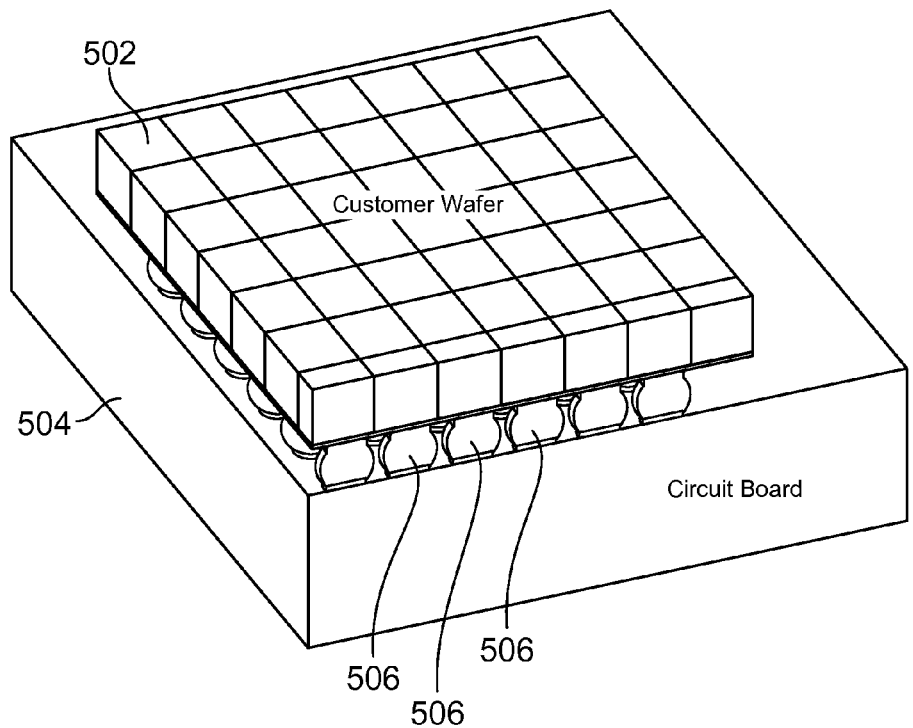
FIG. 5A depicts an angled-top-cross-sectional-view illustration of a model that shows a chip that has been mounted on a circuit board, according to one or more embodiments of the present disclosure.
Figure 5B:
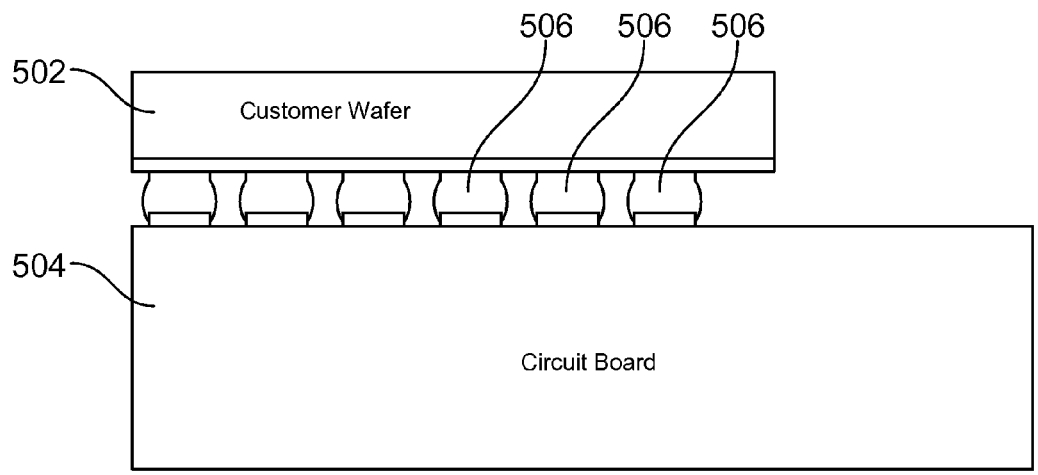
FIG. 5B depicts a side-cross-sectional-view illustration of a model that shows a chip that has been mounted on a circuit board, according to one or more embodiments of the present disclosure.

FIGS. 5A-5B and 6A-6D show illustrations of a number of example simulations that may be run to show how the solder joint reliability (SJR) may change as the shape of the UBM and/or capture pad and/or bump changes. Specific dimensions of the bump and/or the via opening (template) in the repassivation material may affect the SJR. FIGS. 5A and 5B show an integrated circuit and WLCSP package (collectively referred to as the "chip" 502) that has been mounted on a circuit board 504, for example by melting solder balls 506 so that they attach to contact points on the circuit board 504. In some examples or simulations, the chip 502 may be formed such that it resembles the bump plating technique 200, 300 and/or 400 of FIG. 2I, FIG. 3 and/or FIG. 4 respectively. For explanation and orientation purposes, for example, if the plating technique 300 of FIG. 3 were used, the final chip (or portion thereof) shown in FIG. 3 may be flipped upside down such that the top of solder ball 340 is facing down. Then the chip may be lowered down to make contact with a circuit board, and solder balls of the chip (for example solder ball 340) may be melted so that they attach to contact points on the circuit board. In different examples and/or simulations, the solder balls 506 of FIGS. 5A and 5B may have different dimensions, for example, different dimensions of the bump and/or the via opening (template) in the repassivation material or solderbrace.

Figure 6A:
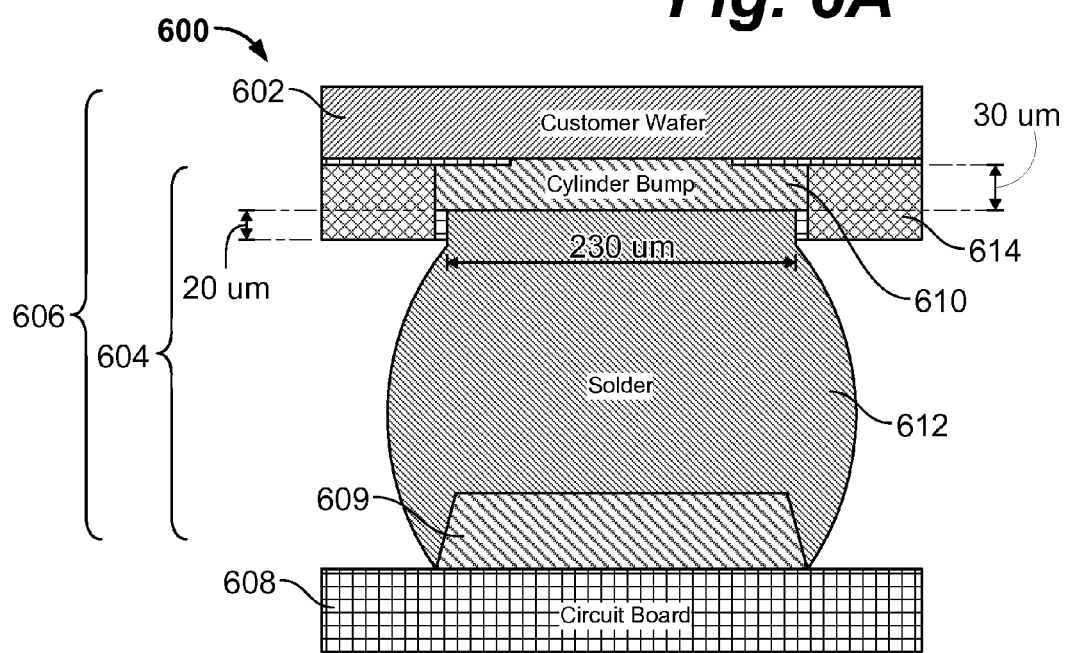
FIG. 6A shows a side-view illustration of a model of a bump plating and mounting design and/or configuration.

FIG. 6A shows an illustration of a side view of a bump plating and mounting configuration 600, according one or more embodiments of the present disclosure. FIG. 6A shows an integrated circuit 602 (or die or customer wafer or semiconductor wafer) and a WLCSP package 604 (collectively referred to as a "chip" 606) mounted to a circuit board 608 that may include one or more contact points 609. The WLCSP package 604 may include a UBM and/or contact pad and/or bump 610, a solder ball 612 and, optionally, a repassivation layer 614 or solderbrace that may surround a portion of the bump 610 and a portion of the solder ball 612. The bump 610 may have a thickness, for example 30 um. Additionally, the repassivation layer 614 may have a thickness beyond the thickness of the bump 610, for example by 20 um. This additional thickness of the repassivation layer 614 may contact and surround a portion of the solder ball 612. This bump plating and mounting configuration 600 will exhibit SJR characteristics, for example a mean life (in cycles) and a number of cycles before a first failure. These SJR characteristics will be summarized and described below.

Figure 6B:
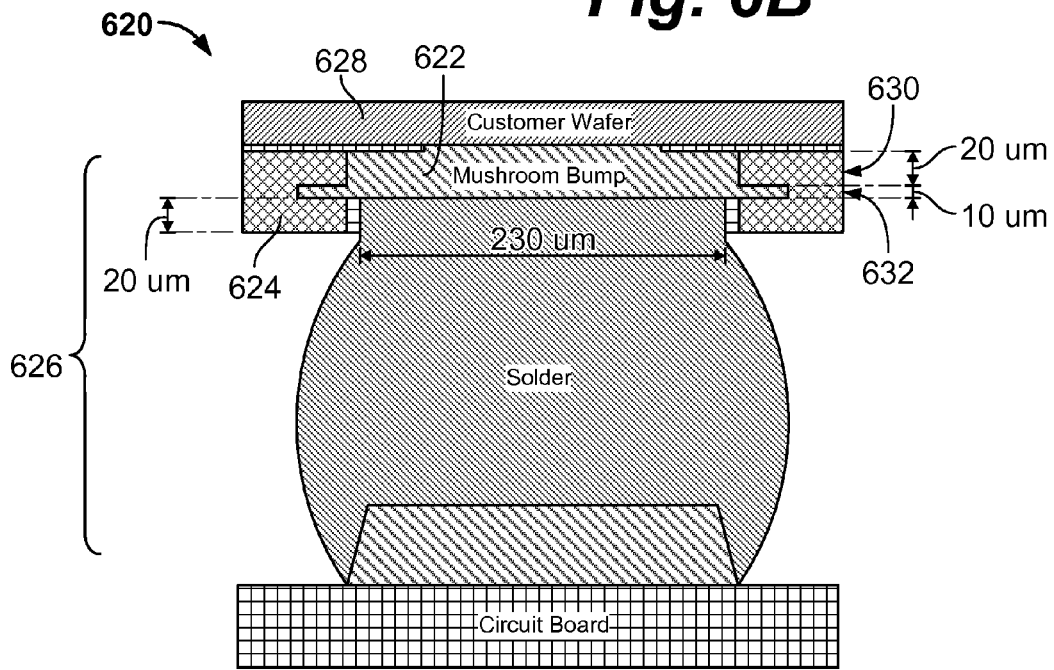
FIG. 6B shows a side-view illustration of a model of a bump plating and mounting design and/or configuration, according to one or more embodiments of the present disclosure.

FIG. 6B shows an illustration of a side view of a bump plating and mounting configuration 620, according to one or more embodiments of the present disclosure. The mounting configuration may exhibit many of the same components and/or features as the bump plating and mounting configuration 600 of FIG. 6A, for example. Additionally, the WLCSP package 626 may be formed in substantially the same manner as the bump plating technique 200 of FIG. 2I. Referring to FIG. 6B, the UBM and/or contact pad and/or bump 622 may be a mushroom shaped bump 622. It should be understood that although configuration 620 shows the mushroom shaped bump 622 as having rectangular features, the mushroom shaped bump may be shaped similar to the mushroom shaped bump 222 of FIG. 2I. Like the mushroom shaped bump 222 of FIG. 2I, the edges of mushroom shaped bump 622 may be raised up off the customer wafer 628 and may rest on (and apply pressure in the direction of) a repassivation material 624, such as solderbrace, instead of the customer wafer. Referring to FIG. 6B (and FIG. 2I), it can be seen that the mushroom shaped bump 622 may have a suitable total thickness such as, for example, about 30 um. The total thickness of the mushroom shaped bump 622 may include a side wall thickness 630 and a cap thickness 632. In some embodiments, the side wall thickness 630 may be about 20 um and the cap thickness 632 may be about 10 um. Additionally, the repassivation layer 624 may have a thickness beyond the thickness of the mushroom shaped bump 622, for example by about 20 um. This additional thickness of the repassivation layer 624 may contact and surround a portion of the solder ball. It should be understood that the present disclosure contemplates other thicknesses and distances with regard to the mushroom shaped bump 622 and/or the repassivation layer 624. The thicknesses shown in FIG. 6B are examples that may be used to run a number of simulations. This bump plating and mounting configuration 620 will exhibit SJR characteristics, for example a mean life (in cycles) and a number of cycles before a first failure. These SJR characteristics will be summarized and described below.

Figure 6C:
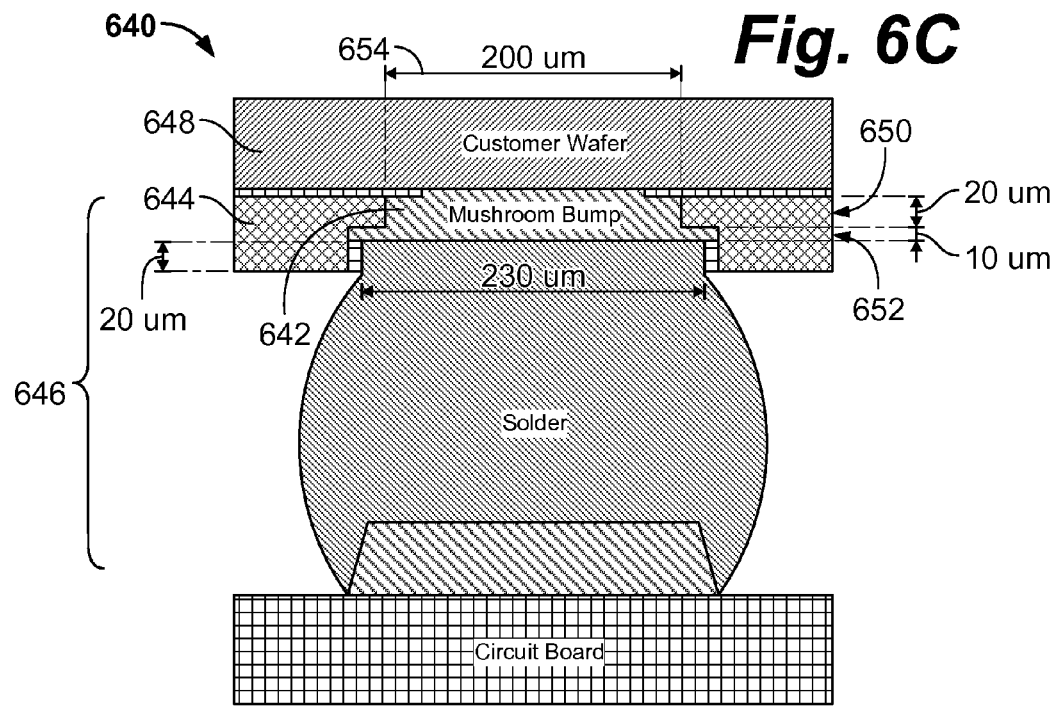
FIG. 6C shows a side-view illustration of a model of a bump plating and mounting design and/or configuration, according to one or more embodiments of the present disclosure.

FIG. 6C shows an illustration of a side view of a bump plating and mounting configuration 640, according to one or more embodiments of the present disclosure. The mounting configuration may exhibit many of the same components and/or features as the bump plating and mounting configuration 600 of FIG. 6A, for example. Additionally, the WLCSP package 646 may be formed in substantially the same manner as the bump plating technique 300 of FIG. 3, for example. Referring to FIG. 6C, the UBM and/or contact pad and/or bump 642 may be a mushroom shaped bump 642. It should be understood that although configuration 620 shows the mushroom shaped bump 622 as having rectangular features, the mushroom shaped bump may be shaped similar to the mushroom shaped bump 322 of FIG. 3, for example. Like the mushroom shaped bump 322 of FIG. 3, the edges of mushroom shaped bump 642 may be raised up off the customer wafer 648 and may rest on (and apply pressure in the direction of) a repassivation material 644, such as solderbrace, instead of the customer wafer. Referring to FIG. 6C (and FIG. 3), it can be seen that the mushroom shaped bump 642 may have a suitable total thickness such as, for example, about 30 um. The total thickness of the mushroom shaped bump 642 may include a side wall thickness 650 and a cap thickness 652. In some embodiments, the side wall thickness 650 may be about 20 um and the cap thickness 652 may be about 10 um. The mushroom shaped bump 642 may have a reduced base diameter (distance 654), for example when compared to the embodiments of FIGS. 6A and 6B. In some embodiments, the base diameter may be about 200 um, and in other embodiments, the base diameter may be less or more than 200 um. This bump plating technique that exhibits a narrower base and a bump lip that extends further outward beyond the side walls of the mushroom shaped bump may be referred to as "necking," and, for example, the mushroom shaped bump shown in FIG. 6C may be said to have a necking of 200 um. Additionally, the repassivation layer 644 may have a thickness beyond the thickness of the mushroom shaped bump 642, for example by about 20 um. This additional thickness of the repassivation layer 644 may contact and surround a portion of the solder ball. It should be understood that the present disclosure contemplates other thicknesses and distances with regard to the mushroom shaped bump 642 and/or the repassivation layer 644. The thicknesses shown in FIG. 6C are examples that may be used to run a number of simulations. This bump plating and mounting configuration 640 will exhibit SJR characteristics, for example a mean life (in cycles) and a number of cycles before a first failure. These SJR characteristics will be summarized and described below.

Figure 6D:
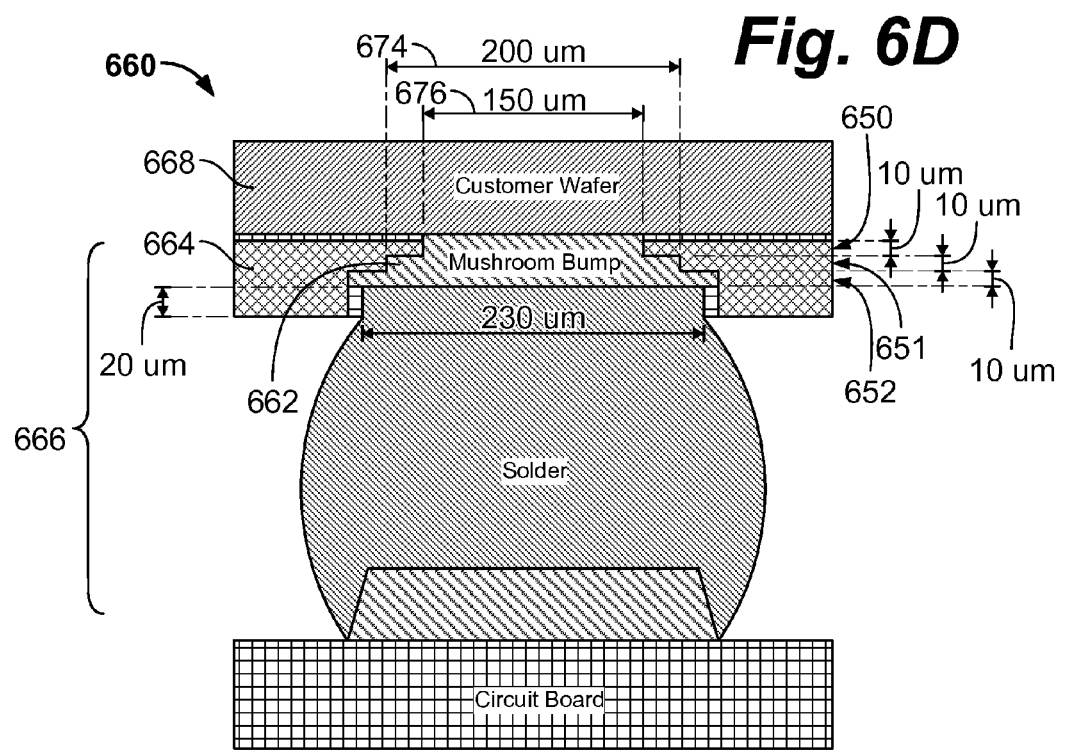
FIG. 6D shows a side-view illustration of a model of a bump plating and mounting design and/or configuration, according to one or more embodiments of the present disclosure.

FIG. 6D shows an illustration of a side view of a bump plating and mounting configuration 660, according to one or more embodiments of the present disclosure. The mounting configuration may have many of the same components as the bump plating and mounting configuration 600 of FIG. 6A. Additionally, the WLCSP package 666 may be formed in substantially the same manner as the bump plating technique 400 of FIG. 4, for example. Referring to FIG. 6D, the UBM and/or contact pad and/or bump 662 may be a mushroom shaped bump 662. It should be understood that although configuration 620 shows the mushroom shaped bump 622 as having rectangular features, the mushroom shaped bump may be shaped similar to the mushroom shaped bump 422 of FIG. 4, for example. Like the mushroom shaped bump 422 of FIG. 4, the edges of mushroom shaped bump 662 may be raised up off the customer wafer 668 and may rest on (and apply pressure in the direction of) a repassivation material 664, such as solderbrace, instead of the customer wafer. Referring to FIG. 6D (and FIG. 4), it can be seen that the mushroom shaped bump 662 may have a suitable total thickness such as, for example, about 30 um. The total thickness of the mushroom shaped bump 642 may include a first side wall thickness 650, a second side wall thickness 651 and a cap thickness 652. In some embodiments, the first side wall thickness 650 may be about 10 um, the second side wall thickness 651 may be about 10 um and the cap thickness 652 may be about 10 um. The mushroom shaped bump 662 may have a reduced base diameter (distance 676), for example when compared to the embodiments of FIGS. 6A and 6B. In some embodiments, the base diameter may be about 150 um. The mushroom shaped bump 662 may have one or more stair-step or bend diameters (for example, distance 674). In some embodiments, the stair-step or bend diameter may be about 200 um. This bump plating technique that exhibits a narrower base, one or more stair-steps in the side wall, and a bump lip that extends further outward beyond the side walls of the mushroom shaped bump may be referred to as "stair-stepped necking" or just "necking," and, for example, the mushroom shaped bump shown in FIG. 6D may be said to have a necking of 150 um. Additionally, the repassivation layer 664 may have a thickness beyond the thickness of the mushroom shaped bump 662, for example by about 20 um. This additional thickness of the repassivation layer 664 may contact and surround a portion of the solder ball. It should be understood that the present disclosure contemplates other thicknesses and distances with regard to the mushroom shaped bump 662 and/or the repassivation layer 664. The thicknesses shown in FIG. 6D are examples that may be used to run a number of simulations. This bump plating and mounting configuration 660 will exhibit SJR characteristics, for example a mean life (in cycles) and a number of cycles before a first failure. These SJR characteristics will be summarized and described below.

The bump plating and mounting configurations shown in FIGS. 6A-6B (and FIGS. 2I, 3 and 4) will exhibit solder joint reliability (SJR) characteristics, for example a mean life (in cycles) and a number of cycles before an first failure. The mean life may be a prediction based on life prediction equations and/or test data. A solder joint "failure" may generally refer to any interruption in the electrical signals that flow through the solder ball between the chip and the circuit board. These SJR characteristics are summarized in Table 1 below, and further described below.

TABLE 1

| Example Embodiment | Bump Shape | Bump Thickness (um) | Necking Diam. (um) | Strain Energy Density (SED) | Solder Joint Reliability (SJR) Mean Life (50%) in cycles | Solder Joint Reliability (SJR) Cycles before First Failure |
| --- | --- | --- | --- | --- | --- | --- |
| FIG. 6A | Cylindrical | 30 | N/A | 0.2966 | 980 | 620 |
| (not shown) | Cylindrical | 20 | N/A | 0.3737 | 770 | 480 |
| (not shown) | Cylindrical | 9 | N/A | 0.4801 | 590 | 370 |
| FIG. 6B | Mushroom | 30(20 + 10) | N/A | 0.3086 | 940 | 590 |
| FIG. 6C | Mushroom | 30(20 + 10) | 200 | 0.2547 | 1150 | 730 |
| FIG. 6D | Mushroom | 30 (10 + 10 + 10) | 150 | 0.2331 | 1270 | 800 |

One useful observation from the examples and/or simulations of FIGS. 6A-6D and the SJR results of Table 1 above is that, in general, a thicker bump leads to a higher SJR (higher mean life and higher cycles before failure). For example, the example embodiments with bump thicknesses of 20 um and 9 um exhibit significantly lower mean life (770, 590) and lower cycles before failure (480, 370) than do any of the other embodiments listed in Table 1, which all have a bump thickness of about 30 um. Strain Energy Density (SED) from simulations are related to SJR life using life-prediction equation. In general, a lower SED leads to a higher SJR life, both a higher mean life and higher cycles before failure. It can be seen in Table 1 that, in general, a thicker bump leads to a lower SED (Higher SJR life).

Another useful observation from the examples and/or simulations of FIGS. 6A-6D and the SJR results of Table 1 above is that a mushroom shaped bump may lead to a higher SJR (higher mean life and higher cycles before failure), when compared to cylindrical shaped bumps or posts. Simulation results of embodiment 6B, with mushroom shaped bump, appear to exhibit almost the same SJR life as the embodiment of 6A; however, the embodiment of 6B may exhibit features that may be important for SJR life improvement, such as via and template openings which help define a mushroom shape, optionally with via necking as shown in the embodiment of 6C and 6D. As shown in Table 1, the example embodiments of 6C and 6D, all with mushroom shaped bumps, all exhibit higher mean life (1150, 1270) and cycles before failure (730, 800) than does a cylindrical bump or post of the same thickness (30 um). Based on simulation estimates the mushroom shaped bumps with necking showed about a 15-30% improvement over similar cylindrical bumps or posts. Therefore, the examples and/or simulations of FIGS. 6A-6D and the SJR results of Table 1 show that a mushroom shaped bump exhibits improved SJR, and this may further be improved by optimizing critical design parameters.

Regarding FIGS. 6A-6D and Table 1, it should be understood that the shape of the bumps shown in the figures are just examples of mushroom shaped bumps, and the bump shapes contemplated by this disclosure are not limited to the exact shapes of the bumps shown in FIGS. 6A-6D. In one or more embodiments, however, an increased bump thickness, an overhanging lip and/or a necking (stair-stepped or not) may be important features. In one or more embodiments of the present disclosure, the dimensions of the bumps and/or the repassivation layers may be larger or smaller than those shown in FIGS. 6A-6D and Table 1. For example, in some embodiments, one or more of the dimensions of the bumps and/or the repassivation layers may be around 10% of the dimensions shown in FIGS. 6A-6D and Table 1. In one specific example, and referring to FIG. 6C, the diameter of the necking 654 may be 20 um instead of 200 um, and the sidewall thickness 650 may be 5um instead of 30 um.

Figure 7:
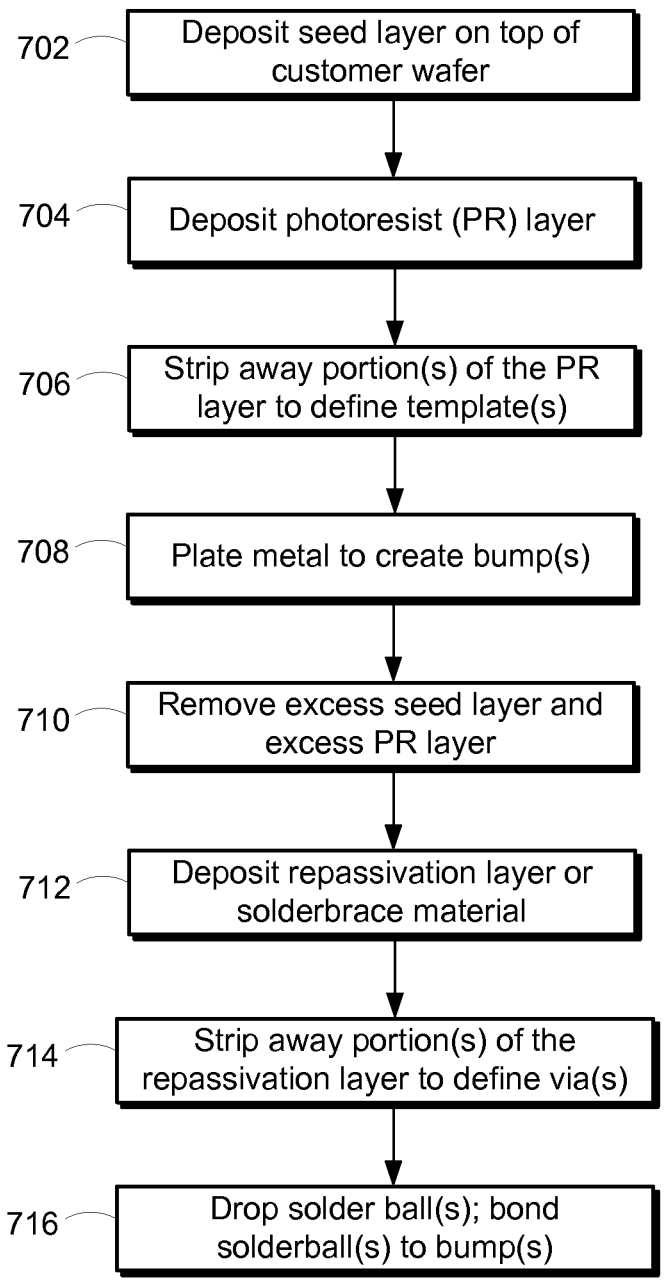
FIG. 7 depicts an illustration of a flow chart showing example steps in a method of forming one or more mushroom shaped bumps on repassivation, according to one or more embodiments of the present disclosure.

Certain embodiments of the present disclosure may be found in one or more methods of forming one or more mushroom shaped bumps on repassivation. FIG. 7 depicts an illustration of a flow chart 700 showing example steps in a method of forming one or more mushroom shaped bumps on repassivation, according to one or more embodiments of the present disclosure. It should be understood that, in some embodiments, one or more of the steps depicted in FIG. 7 may be performed in a different order than depicted. Additionally, in some embodiments, a method of forming one or more mushroom shaped bumps on repassivation may include more or less steps than are depicted in FIG. 7. In some embodiments, the steps described with regard to FIG. 7 may result in and/or use components, materials, layers and the like that are similar to the ones shown and described with regard to FIGS. 2A-2I. It should be understood that even though the steps of FIG. 7 and the components, materials, layers and the like may be discussed in parallel to explain one or more embodiments, variations may exist in the steps or the components, materials, layers and the like.

Referring to FIG. 7 and FIG. 2B, at step 702, a seed layer 210 may be applied on top of a customer wafer (e.g., a semiconductor wafer, for example, produced by a third party or customer and received by a maker of chip scale packages). The seed layer 210 may include an adhesion layer 212, for example, comprised of titanium (Ti) or TiTungsten (TiW). The adhesion layer 212 may serve to adhere the final bump and/or UBM (under bump material or metal) firmly to the customer wafer while still being electrically conductive. Seed layer 210 may include a conductive layer 214, for example, comprised of a metal such as copper (CU). Some embodiments of the present disclosure may use copper (CU) for the conductive layer 214.

Referring to FIG. 7 and FIG. 2C, at step 704, a photoresist (PR) layer 218 is applied, for example, on top of the seed layer 210. Photoresist materials are extremely sensitive to certain types of light and may be developed away when exposed to such light. FIG. 2C shows a PR layer 218, for example, after it has been coated on top of a seed layer 210. Referring to FIG. 7 and FIG. 2D, at step 706, the PR layer 218 may be developed away, for example to reveal a portion of the seed layer 210 below that is above the metal pad of the customer wafer. This process of developing away a portion of the PR layer may also be referred to as "defining the template" within which the UBM and/or capture pad and/or bump may be plated.

If a necking is desired, for example in embodiments of FIGS. 3 and 6C, less of the PR layer may be developed away at step 706 thereby defining a smaller template within which the UBM and/or capture pad and/or bump may be plated. If a stair-stepped or multiple-bend necking is desired, for example in embodiments of FIGS. 4 and 6D, multiple PR layers may be applied at step 704 and multiple PR layers may be developed at step 706. A first PR layer may be developed away resulting in a first intrusion area 450, and a second PR layer may be developed away more than the first, resulting in a second intrusion area 451 that intrudes toward the center of the bump 422 less than the first intrusion area. Both the first developed PR layer and the second developed PR layer may form a stair stepped template within which the UBM and/or capture pad and/or bump may be plated.

Referring to FIG. 7 and FIG. 2E, at step 708, a UBM and/or capture pad and/or bump 222 may be plated within the template defined by the PR layer 218. Bump 222 may be comprised of a metal, such as copper (CU). Some embodiments of the present disclosure may use copper (CU) for the bump 222, for example because copper may be significantly cheaper than other metals used by existing WLCSP techniques, for example, nickel-gold (Ni+Au). It should be understood that the bump 222 could be comprised of other metals, such as nickel (Ni), nickel-copper (Ni+Cu) and/or nickel-gold (Ni+Au). Referring to FIG. 7 and FIG. 2F, at step 710, excess portions of the PR layer 218 and excess portions of the adhesion layer 212 and the conductive layer 214 (collectively, the seed layer), may be removed. Because the PR layer 218 is made of a photoresist material, it may be developed away by exposing it to certain types of light. The adhesion layer 212 and the conductive layer 214 (collectively, the seed layer) may be etched by exposing them to certain types of chemicals. Removing the PR layer 218 and the seed layer (adhesion layer 212 and conductive layer 214) may serve to electrically isolate the bump 222 from other conductive structures applied on the customer wafer, for example other bump structures.

Referring to FIG. 7 and FIG. 2G, at step 712, a repassivation layer 230 may be applied. In some embodiments, the repassivation layer 230 is a solderbrace (sb) or solderbrace material. The repassivation layer may be comprised of photo-imageable or photosensitive polymer film with excellent electrical and/or mechanical properties. For example, polymers used in repassivation may include polybenzoxazole (PBO) and/or polyimide (PI). The repassivation layer 230 or the sb may be screen printed (or just "printed") over the top of the customer wafer and the bump 222. The screen printing process may apply the repassivation material through a mesh. In alternate embodiments, other processes could be used to apply the repassivation layer 230, for example, the repassivation layer may be sprayed, coated, laminated or the like. Referring to FIG. 7 and FIG. 2H, at step 714, portions of the repassivation layer 230 may be developed away to define one or more vias 232. The via 232 may extend through the repassivation layer 230 to expose the bump 222. Because the repassivation layer 230 may be made of a photosensitive material, it may be developed after exposing it to certain types of light. It should be understood that although steps 712 and 714 indicate steps that deposit and process a repassivation layer, alternate embodiments of the present disclosure may exclude or omit steps related to the repassivation layer. Therefore, some embodiments of the present disclosure may include a bump, without a repassivation layer. In other words, the systems, methods, routines and/or techniques of the present disclosure may be used to form mushroom shaped bumps on a customer wafer, either with or without a repassivation layer.

Referring to FIG. 7 and FIG. 2I, at step 716, a solder ball 240 may be placed (or dropped) on top of the bump 222, for example, at least partially within a via 232 defined by side walls 231 (see FIG. 2H) of the repassivation layer 230. In some embodiments, once the ball is placed, the whole wafer may be heated up, for example using a reflow process, causing the solder ball 240 to melt and bond to the metal of the bump 222. At this point, the customer wafer and the package (bump, repassivation layer, solder ball, etc.) may be mounted on a circuit board. The steps of FIG. 7 may result in a mushroom shaped bump similar to the one described with regard to FIG. 2I. It should be understood that the shape of the bump shown in FIG. 2I is just one example of a mushroom shaped bump, and the bump shapes contemplated by this disclosure are not limited to the exact shape of the bump shown in FIG. 2I. In one or more embodiments, however, an increased bump thickness, an overhanging lip and necking may be important features.

FIG. 7 is just one example of a method of forming one or more mushroom shaped bumps on repassivation, according to one or more embodiments of the present disclosure. The systems, methods, routines and/or techniques described in the present disclosure may be applied to other known methods of forming WLCSP packages.

Various embodiments of the present disclosure describe one or more systems, methods and/or techniques for mushroom shaped bump on repassivation. In one or more embodiments, a method of forming a chip scale package may include applying a first photoresist layer (for example, layer 218) over a semiconductor wafer, developing away a portion of the first photoresist layer (for example, layer 218) to define a cylindrically shaped template with substantially vertical side walls, and plating metal at least partially within the template to form a bump (for example, bump 222). The bump may include a first cylindrical base portion (for example, base 302), a cap (for example, cap 246), and a lip (for example, lip 248) formed by a portion of the cap that extends horizontally outward beyond the first cylindrical base portion. The cap and lip may be formed such that a vertical distance exists between the lip (for example, lip 248) and the semiconductor wafer defining an intrusion area (for example, intrusion area 250). In one or more embodiments, the method may include removing excess portions of the first (for example, layer 218), for example, portions residing in the intrusion area (for example, intrusion area 250), to isolate the bump (for example, bump 222). In one or more embodiments, the metal used to form the bump (for example, bump 222) is copper.

In one or more embodiments, the method may include depositing a repassivation material (for example, material 230) over the semiconductor wafer such that the repassivation material at least partially surrounds and/or covers the bump (for example, bump 222), and such that the repassivation material fills in the intrusion area (for example, intrusion area 250) defined by the vertical distance between the lip (for example, lip 250) of the bump and the semiconductor wafer. In some embodiments, the repassivation material (for example, material 230) is solderbrace. In some embodiments, the repassivation material (for example, material 230) may be applied over the semiconductor wafer using a screen printing process. In one or more embodiments, the method may include defining a via (for example, via 232) in the repassivation material (for example, material 230) by developing away a portion of the repassivation material to expose a portion of the bump (for example, bump 222).

In one or more embodiments, the method may include depositing a second photoresist layer over the first photoresist layer (for example, layer 218), and developing away a portion of the second photoresist layer. The portion of the second photoresist layer that is developed away may have a diameter that is larger than the portion of the first photo resist layer that was developed away, for example, to add a stair-stepped or multi-bend profile to the side walls of the template, for example, as shown in FIG. 4. In the embodiments where the side walls of the template have a stair-stepped or multi-bend profile, the step of plating metal at least partially within the template results in a bump (for example, bump 422) that further includes a second cylindrical base portion (for example, the base with diameter of 200 um as shown in FIG. 4) having a larger diameter than the first cylindrical base portion (for example, base 402).

One or more embodiments of the present disclosure describe a chip scale package that may include a bump (for example, bump 222) formed of metal. The bump may include a cylindrical base portion (for example, base 302) with substantially vertical side walls. The cylindrical base portion may sit directly or indirectly upon a semiconductor wafer. The bump may include a cap (for example, cap 246) that may be located vertically above the cylindrical base portion. The bump may include a lip (for example, lip 248) formed by a portion of the cap that extends horizontally outward beyond the cylindrical base portion. The cap and lip may be formed such that a vertical distance exists between the lip (for example, lip 248) and the semiconductor wafer defining an intrusion area (for example, intrusion area 250). In some embodiments, the bump (for example, bump 222) is formed of copper. In some embodiments, the cap (for example, cap 246) may have a domed shape with a vertical or axial thickness that increases toward the radial center of the bump. As one example, and referring to FIG. 2I, vertical reference lines may run up/down when the figure is oriented for proper viewing, and axial reference lines may run left/right when the figure is oriented for proper viewing. In some embodiments, the diameter of the cylindrical base portion (for example, base 302) may increase axially toward the top of the cylindrical base portion such that the vertical side walls (for example, side walls 306) of the cylindrical base portion slope radially outward. In some embodiments, the vertical or axial thickness (for example, thickness 630 or 650) of the cylindrical base portion of the bump is about 20 um, and the vertical or axial thickness (for example, thickness 632 or 652) of the cap of the bump is about 10 um. In some embodiments, the diameter (for example, diameter 302, 654 or 674) of the first cylindrical base portion of the bump is about 200 um.

In one or more embodiments of the present disclosure, the chip scale package may include a repassivation material (for example, material 230) that covers the semiconductor wafer and at least partially surrounds and/or covers the bump (for example, bump 222). The repassivation material may fill in the intrusion area (for example, intrusion area 250) defined by the vertical distance between the lip (for example, lip 248) of the bump and the semiconductor wafer. In some embodiments, the repassivation material may define a via (for example, via 232) that extends vertically or axially through the repassivation material (for example, material 230) to expose a portion of the bump (for example, bump 222). In some embodiments, the repassivation material (for example, material 230) is solderbrace. In some embodiments, the repassivation material (for example, material 230) may include polybenzoxazole (PBO) and/or polyimide (PI).

One or more embodiments of the present disclosure describe a chip scale package that may include a bump (for example, bump 422) formed of metal. The bump may include a first cylindrical base portion (for example, base 402) with substantially vertical first side walls. The first cylindrical base portion may sit directly or indirectly upon a semiconductor wafer. The bump may include a second cylindrical base portion (for example, the base defined by diameter 200 um as shown in FIG. 4) with substantially vertical second side walls. The second cylindrical base portion may be located vertically above the first cylindrical base portion. The second cylindrical base portion may have a larger diameter than the first cylindrical base portion. In some embodiments, the first side walls of the first cylindrical base portion and the second side walls of the second cylindrical base portion may together form bump side walls (for example, bump side walls 406) that may have a stair-stepped or multi-bend profile. The bump may include a cap (for example, a cap similar to cap 248) that may be located vertically above the second cylindrical base portion. The bump may include a lip (for example, a lip similar to lip 248) that may be formed by a portion of the cap that extends horizontally outward beyond the second cylindrical base portion. In some embodiments, the vertical or axial thickness (for example, thickness 650) of the first cylindrical base portion of the bump is about 10 um, the vertical or axial thickness (for example, thickness 651) of the second cylindrical base portion of the bump is about 10 um, and the vertical or axial thickness (for example, thickness 652) of the cap of the bump is about 10 um.

Regarding the benefits of mushroom shaped bumps on repassivation, the following describes further benefits of one or more embodiments of the present disclosure. It is to be understood that the described benefits are not limitations or requirements, and some embodiments may omit one or more of the described benefits.

The systems, methods, routines and/or techniques described in the present disclosure may allow for significant reduction in costs. The packaging cost contributes a significant percentage to the total cost of the integrated circuit and/or the final chip; therefore, cost-effective packaging may be important. Additionally, unique features of the mushroom shaped bump, such as additional thickness, a lip that is raised off the customer wafer, and stair stepped side walls, may be added without adding significant cost, for example, because they are formed at the same time as the rest of the bump. Additionally, the systems, methods, routines and/or techniques described in the present disclosure may use cheaper equipment to form the mushroom shaped bumps.

The systems, methods, routines and/or techniques described in the present disclosure result in robust packages that may not require underfill, for example, because of the mushroom shaped bump with increased bump thickness, and the use of solderbrace material or some other repassivation layer. The systems, methods, routines and/or techniques described in the present disclosure may result in packages that are resistant to cracking. In some embodiments, the edge of the mushroom shaped bump may be raised up off the customer wafer (repassivation and/or silicon), and may be padded with repassivation and/or solderbrace. This repassivation layer is not prone to cracking and may be adapted to absorb strain from the edges of the mushroom shaped bump.

The systems, methods, routines and/or techniques described in the present disclosure result in packages that may be integrated into existing die processing and testing services as well as new die processing technologies which may allow a maker of chip scale packages to offer its customers a full turnkey solution for wafer level products. For example, the maker may be able to offer its customers full turnkey wafer bumping, test, die singulation, and tape & reel support for wafer level packaging applications. In addition, a maker may be able to integrate the packages into high performance packaging options, such as Flip Chip CSP (fcCSP) and System in Package (SiP).

The systems, methods, routines and/or techniques described in the present disclosure result in packages ideal for portable communications and related applications that may require a low cost packaging solution with small form factor and improved signal propagation characteristics. EEPROM, flash, DRAM, integrated passive networks, and standard analog devices are all technologies that may benefit from the systems, methods, routines and/or techniques described in the present disclosure. End products may include mobile phones, PDAs, laptop PCs, disk drives, digital cameras, MP3 players, GPS navigation devices, and other portable products.

Descriptions of the different advantageous embodiments has been presented for purposes of illustration and description and is not intended to be exhaustive or limited to the embodiments in the form disclosed. Many modifications and variations will be apparent to those of ordinary skill in the art. Further different advantageous embodiments may provide different advantages as compared to other advantageous embodiments. The embodiment or embodiments selected are chosen and described in order to best explain the principles of the embodiments the practical application and to enable others of ordinary skill in the art to understand the disclosure for various embodiments with various modifications as are suited to the particular use contemplated.

What is claimed is:

1. A chip scale package, comprising:
    a bump formed of metal, comprising:
    a cylindrical base portion with substantially vertical linear side walls,
        wherein the cylindrical base portion sits directly or indirectly upon a semiconductor die;
    a cap located vertically above the cylindrical base portion; and
    a lip formed above the cylindrical base portion by a linear horizontal bottom portion of the cap that extends horizontally outward beyond the cylindrical base portion,
    wherein the cap and lip are formed such that a vertical distance exists between the lip and the semiconductor die defining an intrusion area.

2. The chip scale package of claim 1, wherein the bump is formed of copper.

3. The chip scale package of claim 1, wherein the cap has a domed shape with a vertical or axial thickness that increases toward the radial center of the bump.

4. The chip scale package of claim 1, wherein the diameter of the cylindrical base portion increases axially toward the top of the cylindrical base portion, and wherein the substantially vertical linear side walls of the cylindrical base portion slope radially outward.

5. The chip scale package of claim 1, further comprising:
    a repassivation material that covers the semiconductor die and at least partially surrounds and/or covers the bump,
        wherein the repassivation material fills in the intrusion area defined by the vertical distance between the lip of the bump and the semiconductor die.

6. The chip scale package of claim 5, wherein the repassivation material defines a via that extends vertically or axially through the repassivation material to expose a portion of the bump.

7. The chip scale package of claim 5, wherein the repassivation material is solderbrace.

8. The chip scale package of claim 5, wherein the repassivation material includes polybenzoxazole (PBO) and/or polyimide (PI).

9. The chip scale package of claim 1, wherein the vertical or axial thickness of the cylindrical base portion of the bump is about 20 um, and the vertical or axial thickness of the cap of the bump is about 10 um.

10. The chip scale package of claim 9, wherein the diameter of the cylindrical base portion of the bump is about 200 um.

11. A chip scale package, comprising:
    a bump formed of metal, comprising:
    a first cylindrical base portion with substantially vertical first side walls,
        wherein the first cylindrical base portion sits directly or indirectly upon a semiconductor die;
    a second cylindrical base portion with substantially vertical second side walls,
        wherein the second cylindrical base portion is located vertically above the first cylindrical base portion,
        wherein the second cylindrical base portion has a larger diameter than the first cylindrical base portion, and
        wherein the first side walls of the first cylindrical base portion and the second side walls of the second cylindrical base portion together form bump side walls with a stair-stepped or multi-bend profile;
    a cap located vertically above the second cylindrical base portion; and
    a lip formed by a portion of the cap that extends horizontally outward beyond the second cylindrical base portion.

12. The chip scale package of claim 11, wherein a vertical or axial thickness of the first cylindrical base portion of the bump is about 10 um and a vertical or axial thickness of the second cylindrical base portion of the bump is about 10 um.

13. The chip scale package of claim 11, wherein the bump is formed of copper.

14. The chip scale package of claim 11, wherein the cap has a domed shape with a vertical or axial thickness that increases toward a radial center of the bump.

15. The chip scale package of claim 11, wherein the diameter of the second cylindrical base portion increases axially toward a top of the second cylindrical base portion, and wherein the substantially vertical second side walls of the second cylindrical base portion slope radially outward.

16. The chip scale package of claim 11, further comprising:
    a repassivation material that covers the semiconductor die and at least partially surrounds and/or covers the bump,
        wherein the repassivation material fills in an intrusion area defined by the vertical distance between the lip of the bump and the semiconductor die.

17. The chip scale package of claim 16, wherein the repassivation material defines a via that extends vertically or axially through the repassivation material to expose a portion of the bump.

18. The chip scale package of claim 16, wherein the repassivation material is solderbrace.

19. The chip scale package of claim 16, wherein the repassivation material includes polybenzoxazole (PBO) and/or polyimide (PI).

20. The chip scale package of claim 11, wherein a vertical or axial thickness of the cap of the bump is about 10 um.

* * * * *